United States Patent
Tsai et al.

(10) Patent No.: US 9,711,620 B2
(45) Date of Patent: Jul. 18, 2017

(54) METHOD FOR FINFET DEVICE

(71) Applicant: Taiwan Semiconductor Manufacturing Company, Ltd., Hsin-Chu (TW)

(72) Inventors: Chun Hsiung Tsai, Hsinchu County (TW); Kuo-Feng Yu, Hsinchu County (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 0 days.

(21) Appl. No.: 15/150,073

(22) Filed: May 9, 2016

(65) Prior Publication Data
US 2016/0254365 A1    Sep. 1, 2016

Related U.S. Application Data

(63) Continuation of application No. 14/269,947, filed on May 5, 2014, now Pat. No. 9,337,316.

(51) Int. Cl.
*H01L 29/66* (2006.01)
*H01L 21/225* (2006.01)
(Continued)

(52) U.S. Cl.
CPC .... *H01L 29/66636* (2013.01); *H01L 21/2251* (2013.01); *H01L 21/324* (2013.01); *H01L 29/0847* (2013.01); *H01L 29/6656* (2013.01); *H01L 29/6659* (2013.01); *H01L 29/66553* (2013.01); *H01L 29/66689* (2013.01); *H01L 29/66795* (2013.01); *H01L 29/66803* (2013.01);
(Continued)

(58) Field of Classification Search
None
See application file for complete search history.

(56) References Cited

U.S. PATENT DOCUMENTS 5,168,072 A    12/1992   Moslehi
9,048,254 B2   6/2015    Chen et al.
(Continued)

OTHER PUBLICATIONS

Michael I. Current et al., "Microwave and RTA Annealing of Phos-Doped, Strained Si(100) and (110) Implanted with Molecular Caron Ions", Ion Implantation and Annealing: New Process and Products section of SEMICON West 2013, San Francisco CA., Jul. 11, 2013, 17 pages, Junction Technology Group.
(Continued)

*Primary Examiner* — Angel Roman
*Assistant Examiner* — Kevin Quinto
(74) *Attorney, Agent, or Firm* — Haynes and Boone, LLP

(57) ABSTRACT

A fin field effect transistor (FinFET) comprises a substrate; a fin over the substrate, the fin having a channel region; a gate structure engaging the fin adjacent to the channel region; and a spacer on sidewalls of the gate structure. The FinFET further includes first and second heavily doped source/drain (HDD) features at least partially in the fin, on opposing sides of the gate structure, and adjacent to the spacer. The FinFET further includes first and second lightly doped source/drain (LDD) regions in the fin between the first and second HDD features, respectively, and the channel region. A sidewall of the first HDD feature and a sidewall of the first LDD region have substantially a same shape.

20 Claims, 9 Drawing Sheets

(51) Int. Cl.
*H01L 21/324* (2006.01)
*H01L 29/08* (2006.01)
*H01L 29/78* (2006.01)

(52) U.S. Cl.
CPC ...... *H01L 29/7833* (2013.01); *H01L 29/7851* (2013.01)

(56) References Cited

U.S. PATENT DOCUMENTS

| | | |
|---|---|---|
| 2007/0042612 A1 | 2/2007 | Nishino et al. |
| 2012/0161238 A1* | 6/2012 | Scheiper ......... H01L 21/823412 257/368 |
| 2013/0040455 A1 | 2/2013 | Chan et al. |
| 2013/0249021 A1 | 9/2013 | Asenov et al. |
| 2013/0266741 A1 | 10/2013 | Song et al. |
| 2014/0008736 A1 | 1/2014 | Li et al. |

OTHER PUBLICATIONS

Bo Lojek, "Low Temperature Microwave Annealing of S/D," 16th IEEE International Conference on Advanced thermal Processing of Semiconductors—RTP2008, 9 pages.

* cited by examiner

US 9,711,620 B2

METHOD FOR FINFET DEVICE

PRIORITY

This is a continuation application of U.S. patent application Ser. No. 14/269,947, filed May 5, 2014, entitled "Method for FinFET Device," which is herein incorporated by reference in its entirety.

BACKGROUND

As the semiconductor industry has strived for higher device density, higher performance, and lower costs, problems involving both fabrication and design have been encountered. One solution to these problems has been the development of a fin-like field effect transistor (FinFET). A typical FinFET includes a thin vertical "fin" formed by etching spaced recesses into a substrate. The source, drain, and channel regions are defined within this fin. The transistor's gate is wrapped around the channel region of the fin, engaging it on both the top of the fin and the sidewalls of the fin. This configuration allows the gate to induce current flow in the channel from three sides. Thus, FinFET devices have the benefit of higher current flow and reduced short channel effects.

However, fabricating FinFET devices has various challenges. For example, ion implantation, traditionally used for doping planar devices, has been similarly used for doping FinFET devices to create lightly doped source/drain (LDD) regions in the fin. But due to its directional effect, ion implantation has been found ineffective in creating uniform dopant concentration in the three-dimensional fin. For example, the top portion of the fin typically gets much higher dopant concentration than its lower portion, creating so-called shadowing effects. Consequently, not all advantages of the FinFET devices are realized.

BRIEF DESCRIPTION OF THE DRAWINGS

Aspects of the present disclosure are best understood from the following detailed description when read with the accompanying figures. It is emphasized that, in accordance with the standard practice in the industry, various features are not drawn to scale. In fact, the dimensions of the various features may be arbitrarily increased or reduced for clarity of discussion.

DETAILED DESCRIPTION

Figure 1A:
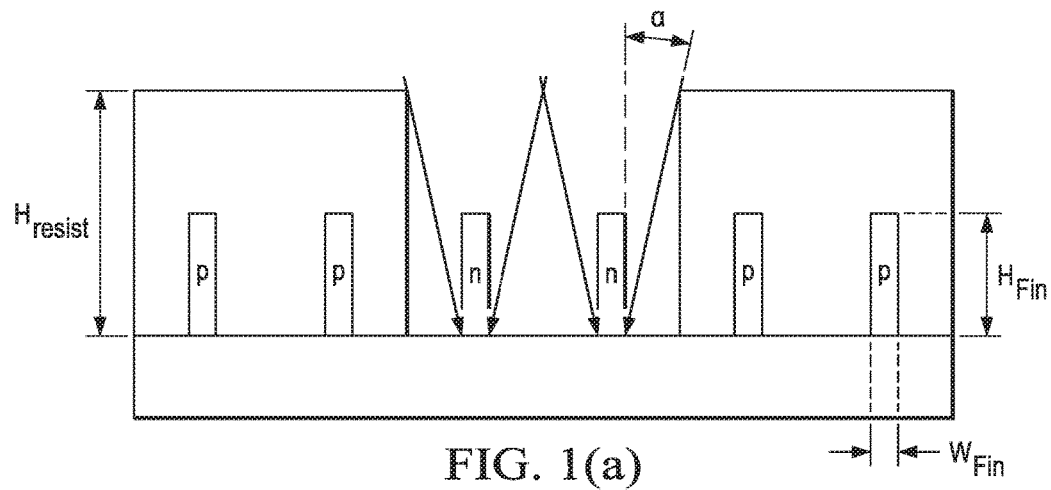
FIGS. 1(a) and 1(b) illustrate FinFET ion implantation shadowing effect.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Figure 1B:
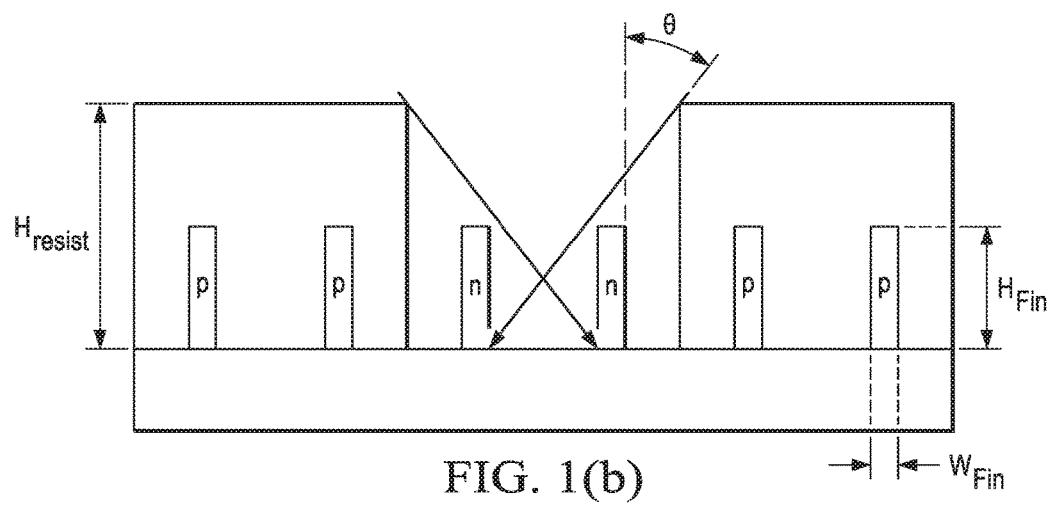

The present disclosure is generally related to methods of forming a semiconductor device, and more particularly to methods of forming and doping a FinFET device. When applying traditional ion implantation to FinFET devices, shadowing effects typically occur. This is because ion implantation is directional and the fin is a three-dimensional structure. When ion implantation is applied from the top of the fin vertically down, the top side of the fin receives much more dopant than the bottom of the fin. As a result, the three sides of the fin do not conduct current equally well and advantages of FinFET are not maximized. Some have tried to overcome this problem by tilting the ion implantation path at an angle, such as angles $\alpha$ and $\theta$ illustrated in FIGS. 1(a) and 1(b). However, these tilting angles are constrained by the height and pitch of the fins, as well as by the height of the masking element (e.g. photoresist) that covers nearby fins during ion implantation. As semiconductor technology progresses to smaller geometries, such as 16 nm or smaller, these tilting angles have become smaller. As has been observed with some static random access memory (SRAM) design in 16 nm process nodes, such tilting angles are approaching vertical—as small as 5 degrees. Consequently, the ion implantation shadowing effects on FinFET have become more problematic.

The present disclosure uses a solid phase dopant diffusion method to overcome the above FinFET shadowing effects. According to the present disclosure, it is possible to achieve uniform dopant concentration on all three sides of the fin even with the latest semiconductor process nodes, thereby maximizing the benefits provided by three-dimensional FinFET technologies.

Figure 2A:
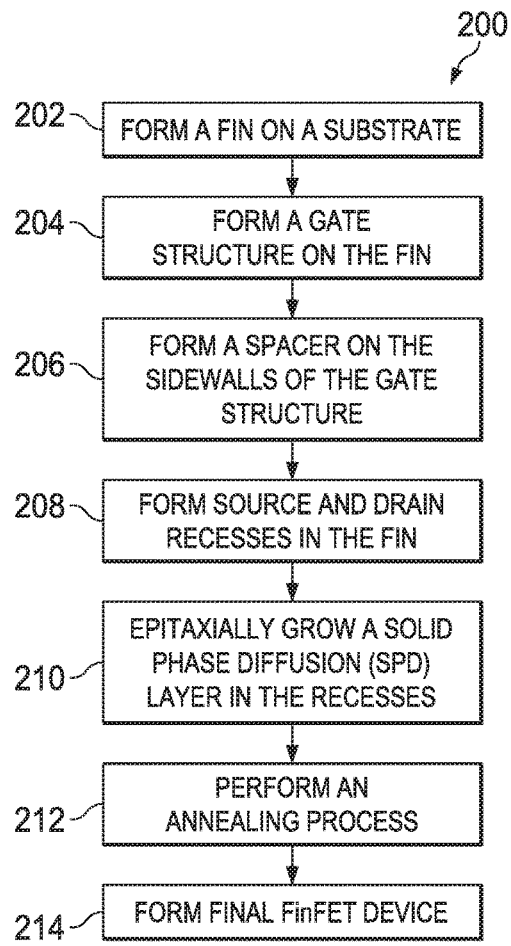
FIGS. 2A and 2B show a block diagram of a method of forming a FinFET device, according to various aspects of the present disclosure.
Figure 2B:
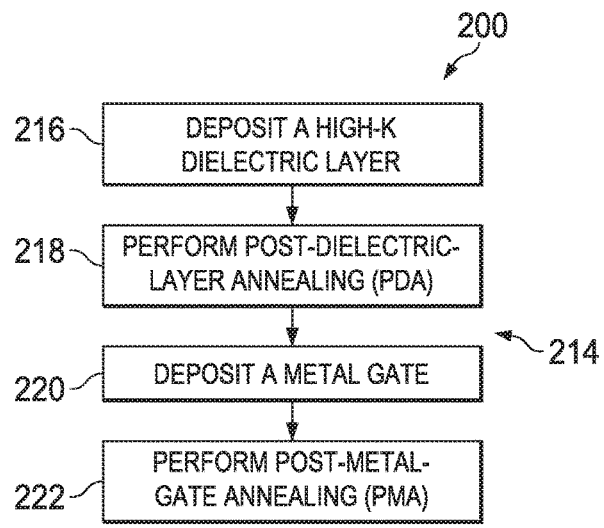

FIGS. 2A and 2B show a block diagram of a method 200 of forming a FinFET device according to various aspects of the present disclosure. One goal of some embodiments of the method 200 is that the FinFET device thus formed will have lightly doped source/drain (LDD) regions that are substantially uniform in dopant concentration. Another goal of some embodiments of the method 200 is that the process can be easily integrated into existing FinFET fabrication flow. The method 200 is merely an example, and is not intended to limit the present disclosure beyond what is explicitly recited in the claims. Additional operations can be provided before, during, and after the method 200, and some operations described can be replaced, eliminated, or moved around for additional embodiments of the method. The method 200 is described below in conjunction with FIGS. 3A-3J which are front views or cross-sectional views of a FinFET device 300 according to various aspects of the present disclosure.

As will be shown, the FinFET device 300 illustrates an n-type FinFET (n-FinFET) in one region of a substrate. This is provided for simplification and ease of understanding and does not necessarily limit the embodiment to any number of devices, any number of regions, or any configuration of structures of regions. Furthermore, the FinFET device 300 may be an intermediate device fabricated during processing of an integrated circuit (IC), or a portion thereof, that may comprise static random access memory (SRAM) and/or other logic circuits, passive components such as resistors, capacitors, and inductors, and active components such as p-type field effect transistors (PFET), n-type FET (NFET), metal-oxide semiconductor field effect transistors (MOSFET), complementary metal-oxide semiconductor (CMOS) transistors, bipolar transistors, high voltage transistors, high frequency transistors, other memory cells, and combinations thereof.

Figure 3A:
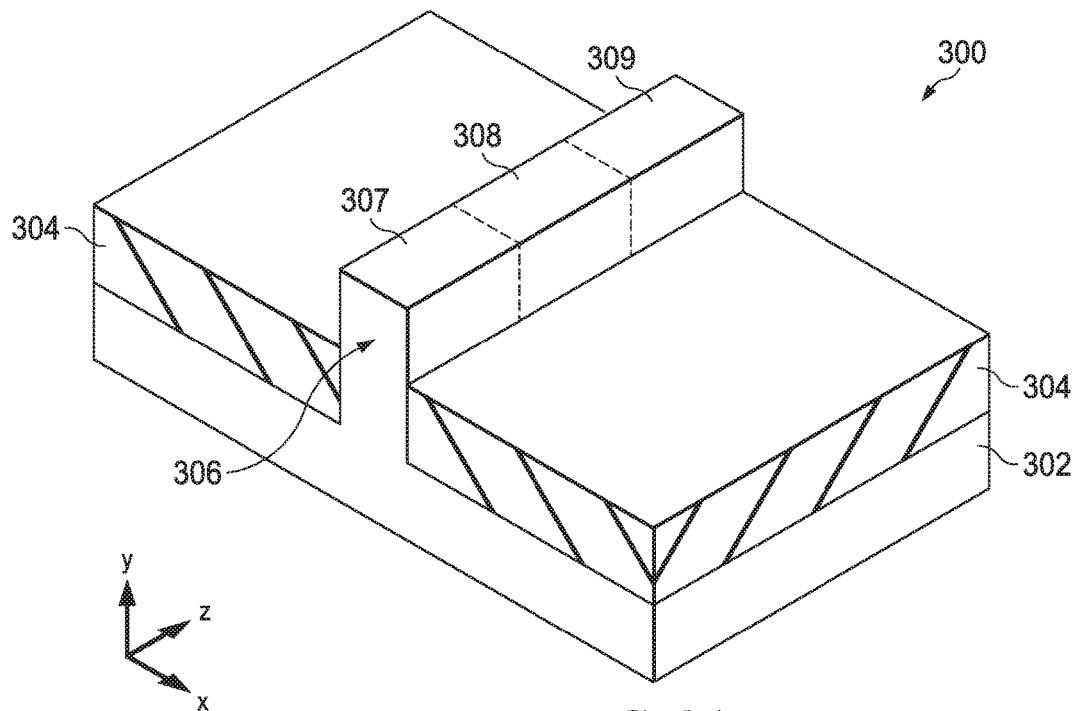
FIGS. 3A, 3B, 3C, 3D, 3E, 3F, 3G, 3H, 3I, and 3J are front or cross-sectional views of forming a FinFET device according to the method of FIGS. 2A and 2B, in accordance with some embodiments.

At operation 202, the method 200 (FIG. 2A) forms a fin (or projection) 306 over a substrate 302 (FIG. 3A). Referring to FIG. 3A, shown therein is the fin 306 extending upwardly from the substrate 302 and surrounded by isolation structures 304 at its bottom portion. The substrate 302 is a silicon substrate in the present embodiment. Alternatively, the substrate 302 may comprise another elementary semiconductor, such as germanium; a compound semiconductor including silicon carbide, gallium arsenic, gallium phosphide, indium phosphide, indium arsenide, and/or indium antimonide; an alloy semiconductor including SiGe, GaAsP, AlInAs, AlGaAs, GaInAs, GaInP, and/or GaInAsP; or combinations thereof. In yet another alternative, the substrate 302 is a semiconductor on insulator (SOI).

The fin 306 includes three portions 307, 308, and 309 along its length direction (the "z" direction). The portions 307 and 309 will include doped source and drain regions of the FinFET device 300, while the portion 308 will include a channel region of the FinFET device 300. Particularly, the portion 308 includes a horizontal side (parallel to the "x-z" plane, also referred to as the top side) and two vertical sides (parallel to the "y-z" plane, also referred to as the sidewalls) that will be engaged with a gate structure (shown in later figures) so as to conduct current flow between the source/drain regions in the portions 307 and 309.

In some embodiments, the fin 306 is formed from the substrate 302 using suitable processes including photolithography and etching processes. The photolithography processes include forming a photoresist layer (resist) overlying the substrate 302, exposing the resist to a pattern, performing post-exposure bake processes, and developing the resist to form a masking element including the resist. The masking element is then used for etching recesses into the substrate 302, leaving the fin 306 on the substrate 302. The etching process can include dry etching, wet etching, reactive ion etching (RIE), and/or other suitable processes. Alternatively, the fin 306 may be formed by double-patterning lithography (DPL) process. DPL allows for enhanced feature (e.g., fin) density. Various DPL methodologies may be used, including double exposure (e.g., using two mask sets), forming spacers adjacent features and removing the features to provide a pattern of spacers, resist freezing, and/or other suitable processes.

After the fin 306 is formed, silicon oxide or other suitable dielectric is deposited and etched to form the isolation structures 304 that surround and isolate fin 306. This may be accomplished by any suitable process, which may include a chemical vapor deposition (CVD) process and an etching process such as dry etching, wet etching, and other suitable etching process. In some embodiments, the isolation structures 304 are shallow trench isolation (STI) features.

Figure 3B:
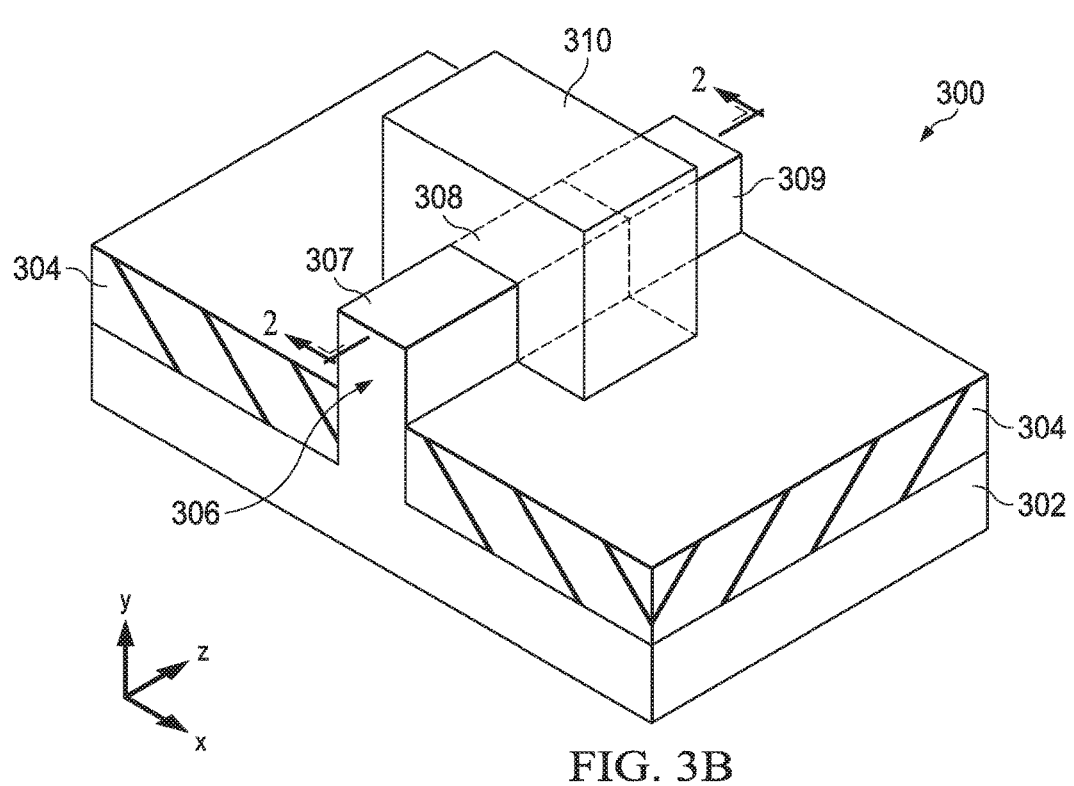
Figure 3C:
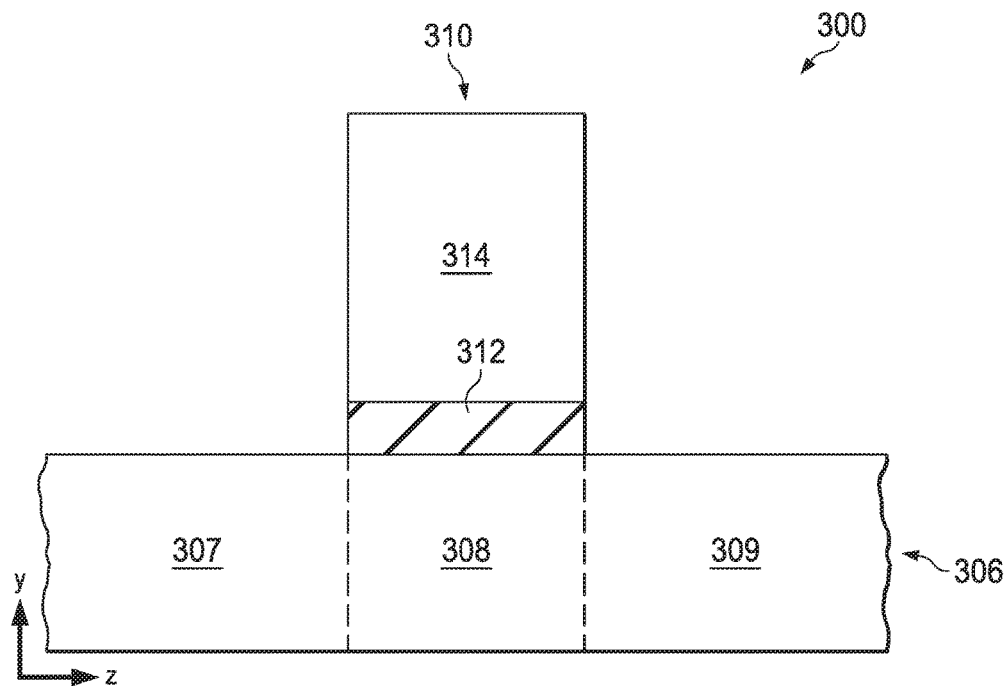

At operation 204, the method 200 (FIG. 2A) forms a gate structure 310 over the fin 306 (FIG. 3B). Referring to FIG. 3B, the gate structure 310 engages the fin 306 on the top and vertical sides thereof. More specifically, the gate structure 310 engages the three sides with the channel region portion 308. FIG. 3C is a cross-sectional view of the FinFET device 300 along the 2-2 line of FIG. 3B. Referring to FIG. 3C, the gate structure 310 includes multiple layers, such as an interfacial layer 312 and a polysilicon (or poly) layer 314. In an embodiment, the gate structure 310 further includes a gate dielectric layer and a metal gate layer disposed between the interfacial layer 312 and the poly layer 314. The interfacial layer 312 may include a dielectric material such as silicon oxide ($SiO_2$) or silicon oxynitride (SiON). The interfacial layer 312 may be formed by chemical oxidation, thermal oxidation, atomic layer deposition (ALD), chemical vapor deposition (CVD), and/or other suitable methods. The poly layer 314 may be formed by suitable deposition processes such as low-pressure chemical vapor deposition (LPCVD) and plasma-enhanced CVD (PECVD). In an embodiment, a hard mask layer is disposed on the gate structure 310 and the hard mask layer may include one or more layers of material such as silicon oxide and/or silicon nitride.

For the sake of convenience, FIGS. 3D-3J show cross-sectional views of the FinFET device 300 along the 2-2 line of FIG. 3B as the FinFET device 300 undergoes various fabrication processes according to embodiments of the present disclosure.

Figure 3D:
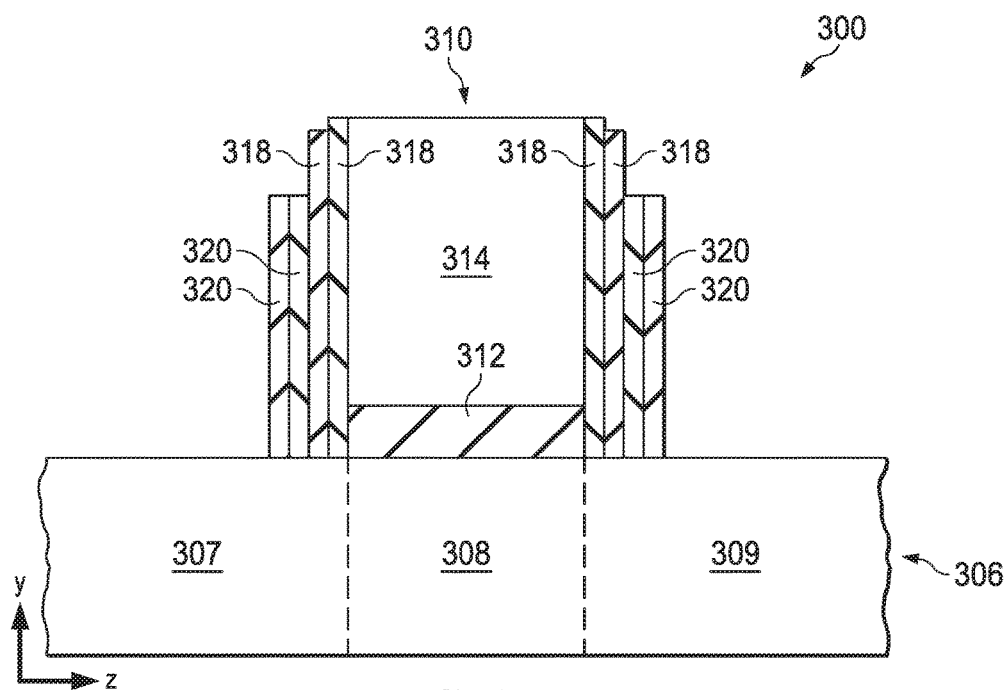

At operation 206, the method 200 (FIG. 2A) forms a spacer on sidewalls of the gate structure 310 (FIG. 3D). Referring to FIG. 3D, the spacer may include multiple layers. In the present embodiment, the spacer includes a seal spacer 318 and a dummy spacer 320. The seal spacer 318 is formed of silicon nitride but may optionally contain silicon oxide as well or, alternatively, be composed of other suitable dielectric material. The seal spacer 318 protects the four approximately vertical sides of the gate structure 310. The dummy spacer 320 can be a multi-layer structure each composed of SiOCN, silicon oxide, silicon nitride, silicon oxynitride, other dielectric material, or combination thereof. In some embodiments, the spacer may include one layer or multiple layers with different material and/or composition than the present embodiment. In an example, the seal spacer 318 is formed by blanket depositing a dielectric layer (e.g., a silicon nitride layer having a uniform thickness) over the FinFET device 300 and then anisotropically etching to remove portions of the dielectric layer to form the seal spacer 318. The dummy spacer 320 may be formed with a similar process.

Figure 3E:
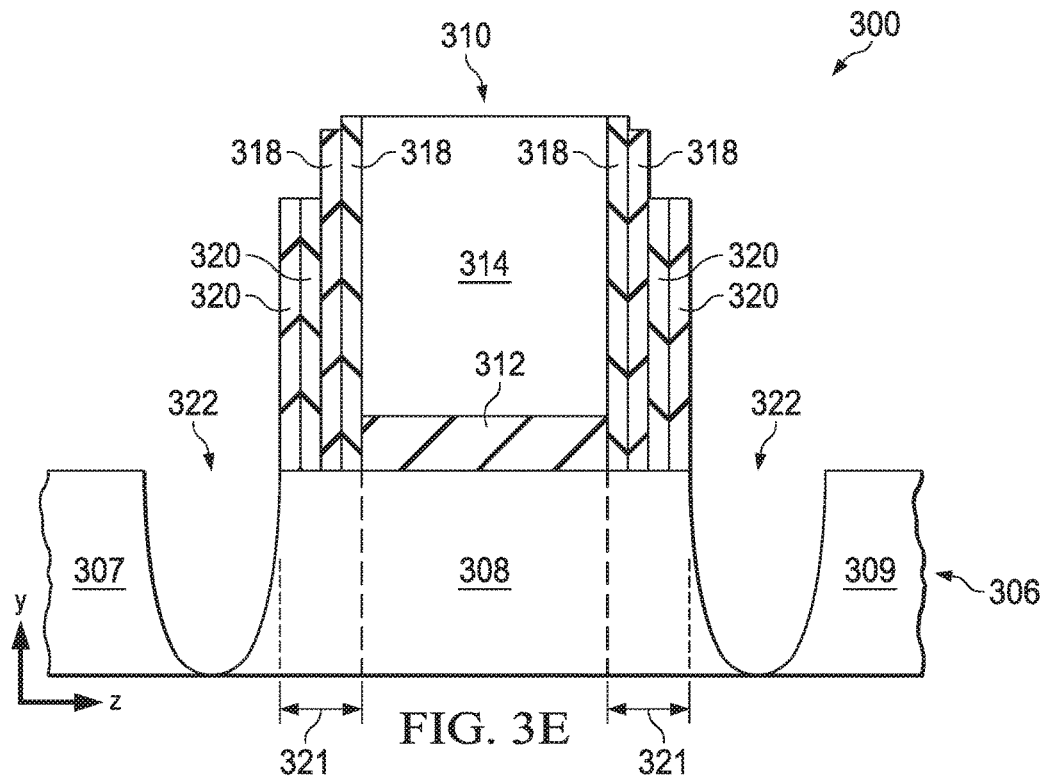
Figure 3F:
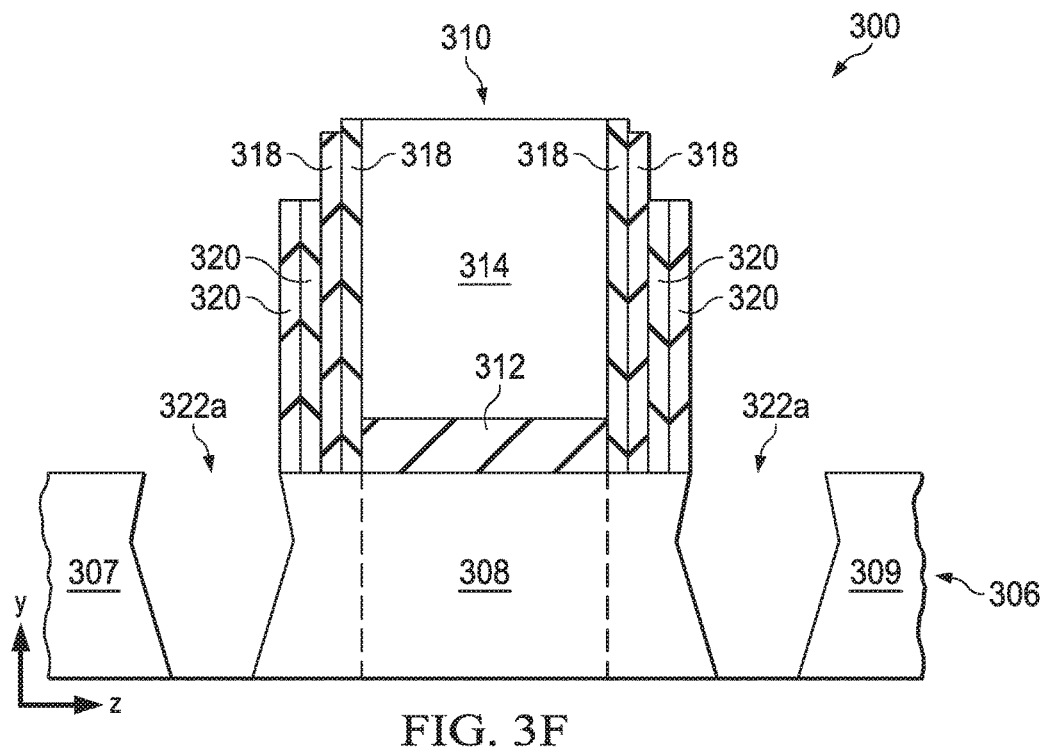

At operation 208, the method 200 (FIG. 2A) forms source and drain recesses 322 in the fin 306 (FIG. 3E). Referring to FIG. 3E, in the present embodiment, the recesses 322 have a substantially u-shaped profile and a sidewall of each of the recesses 322 is substantially aligned with the edge (or outer boundary) of the dummy spacer 320. The respective sidewall is spaced from the channel region portion 308 by a distance 321 in the fin length direction ("z" direction). In the present embodiment, the distance 321 is in a range from about 2 nm to about 10 nm. As will be explained in a later section of the present disclosure, the distance 321 is one of few factors to be considered during a solid phase diffusion operation and it is desirable to have it within the above range. The recesses 322 are formed by a dry etching process, a wet etching process, or a combination thereof. After the etching process, a pre-cleaning process may be performed that clean the recesses 322 with a hydrofluoric acid (HF) solution or other suitable solution. In some embodiment where the spacers 320/318 are thicker than desired, the recesses 322 can be formed to have a substantially diamond-shaped profile, such as recesses 322a in FIG. 3F, so that the distance 321 falls nonetheless into the desirable range. Referring to FIG. 3F, some sidewalls of the recesses 322a are extended towards the channel region 308 underneath the spacers 320/318. In one example, the recesses 322a can be formed with an etching process that includes both a dry etching and a wet etching process where etching parameters thereof are tuned (such as etchants used, etching temperature, etching solution concentration, etching pressure, source power, radio frequency (RF) bias voltage, RF bias power, etchant flow rate, and other suitable parameters) to achieve the desired recess profile.

Figure 3G:
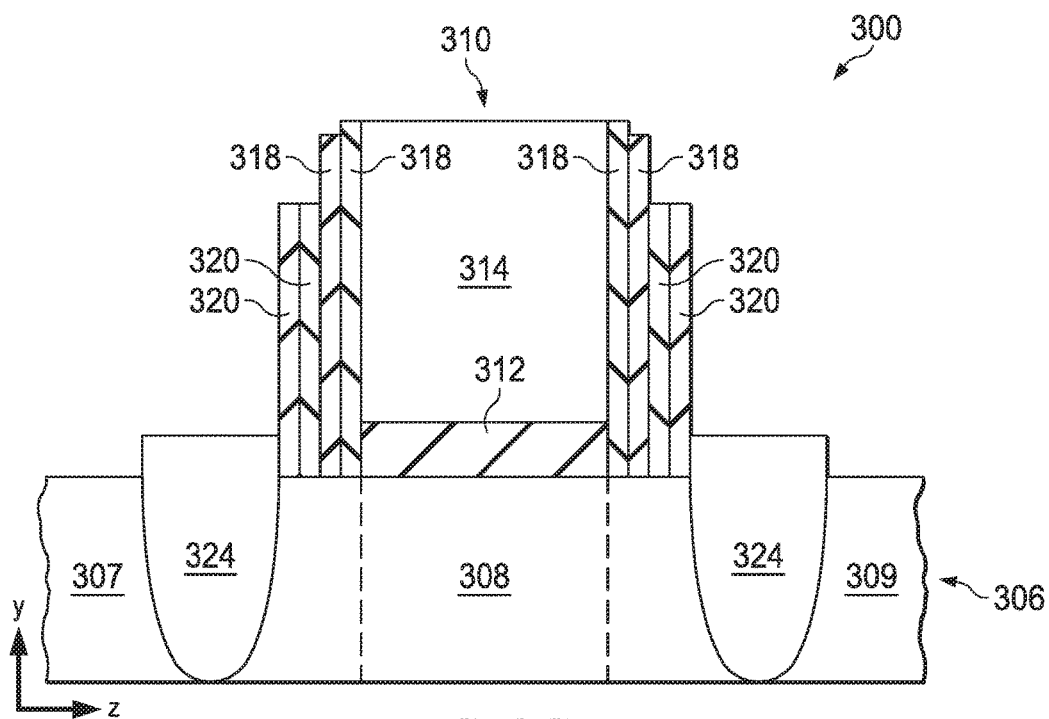

At operation 210, the method 200 (FIG. 2A) grows an epitaxial layer 324 in the recesses 322 (FIG. 3G). Referring to FIG. 3G, the epitaxial layer 324 is heavily doped and functions as a solid phase dopant diffusion (SPD) layer in a later operation. It is also referred to as the SPD layer 324. The SPD layer 324 is formed by one or more selective epitaxial growth (SEG) processes. In an embodiment, the SEG process is a low pressure chemical vapor deposition (LPCVD) process using a silicon-based precursor gas. Further, in the present example, the SEG process in-situ dopes the SPD layer 324 with an n-type dopant such as phosphorus, arsenic, or combinations thereof for forming heavily doped source/drain (HDD) regions of the n-FinFET device 300. In an embodiment, the SPD layer 324 is heavily doped with an n-type dopant with a dopant concentration in a range from about $1 \times e^{21}$ $cm^{-3}$ to about $4 \times e^{21}$ $cm^{-3}$. In an embodiment, the SPD layer 324 includes three layers of epitaxial growth. The first layer has a dopant concentration in a range from about $1 \times e^{21}$ $cm^{-3}$ to about $3 \times e^{21}$ $cm^{-3}$, has a thickness in a range from about 2 nm to about 10 nm, and functions as the solid phase diffusion layer. Over the first layer is the second layer with a dopant concentration in a range from about $2 \times e^{20}$ $cm^{-3}$ to about $7 \times e^{20}$ $cm^{-3}$ and a thickness in a range from about 5 nm to about 10 nm. Over the second layer is the third layer with a dopant concentration in a range from about $2 \times e^{21}$ $cm^{-3}$ to about $3 \times e^{21}$ $cm^{-3}$ and a thickness in a range from about 10 nm to about 20 nm. The third layer reduces contact resistance between the HDD regions of the FinFET device 300 and contact features such as vias. In various embodiments, the dopant concentration in the two SPD layers 324 can be the same or different. In an embodiment, the FinFET device 300 is a p-type FinFET, and the SPD layer 324 is heavily doped with a p-type dopant, such as boron, with a dopant concentration in a range from about $1 \times e^{21}$ $cm^{-3}$ to about $4 \times e^{21}$ $cm^{-3}$.

Figure 3H:
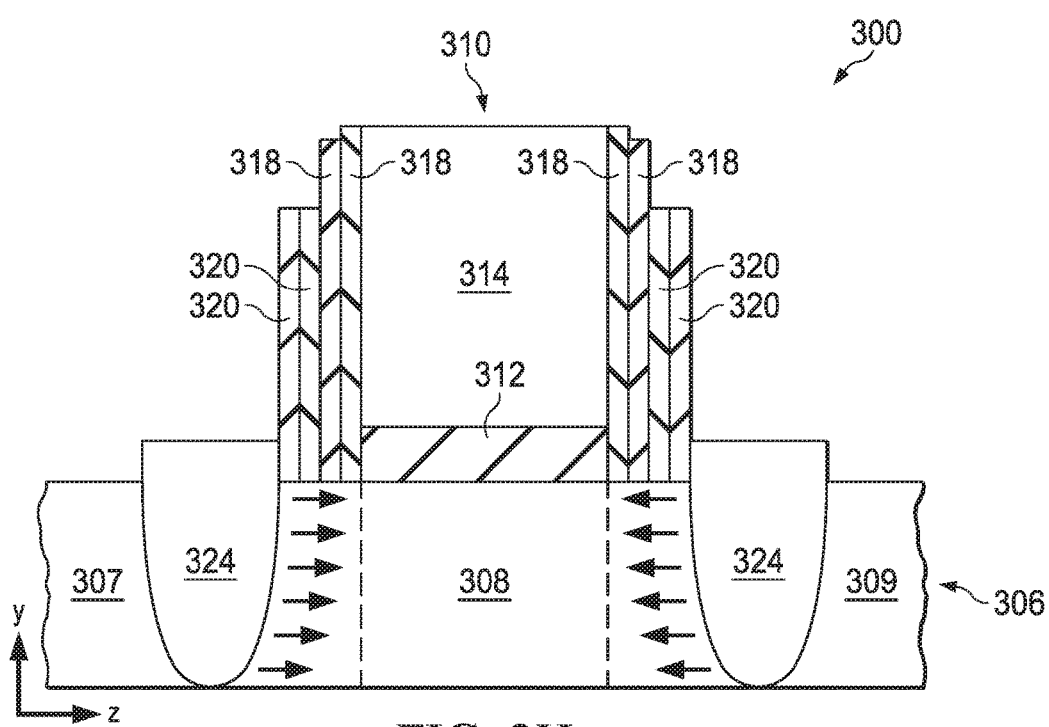
Figure 3I:
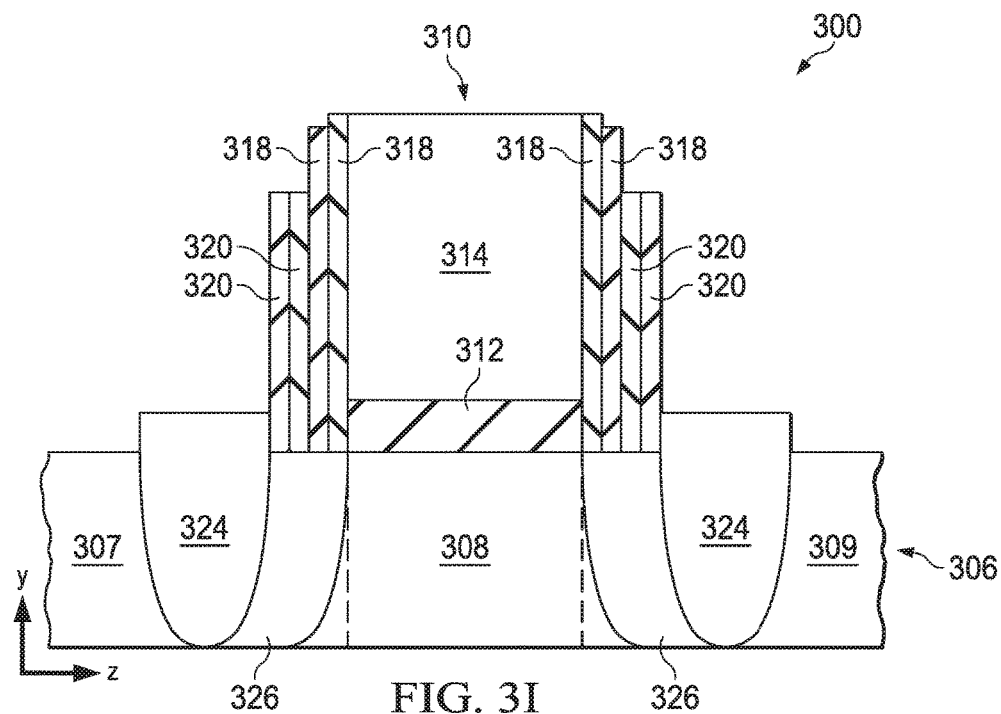

At operation 212, the method 200 (FIG. 2A) performs an annealing process. Referring to FIG. 3H, the annealing process causes the dopant of the SPD layer 324 to diffuse into the portions 307 and 309 underneath the spacers 320/318 towards the channel region 308. In an embodiment, the annealing process includes a microwave annealing (MWA) process. In various embodiments, the MWA process is performed at a temperature in a range from about 500 degree Celsius (° C.) to about 600° C., with a power in a range from about 4 kilowatts (kW) to about 9 kW, and for duration in a range from about 40 seconds to about 200 seconds. In an embodiment, the annealing process further includes a micro-second annealing (μSSA) process before the MWA process. For example, the μSSA process may be performed with a lamp power source at a temperature in a range from about 1000° C. to about 1200° C., and for duration in a range from about 0.8 milliseconds to about 3 milliseconds. In some embodiments, the μSSA process serves to activate the dopant in the SPD layer 324 but does not cause the dopant to diffuse substantially, while the MWA process causes the dopant to diffuse significantly towards the channel region 308. As a result of the operation 212, two lightly doped source/drain (LDD) regions 326 are formed in the fin, sandwiching the channel region 308, as shown in FIG. 3I.

Figure 4:
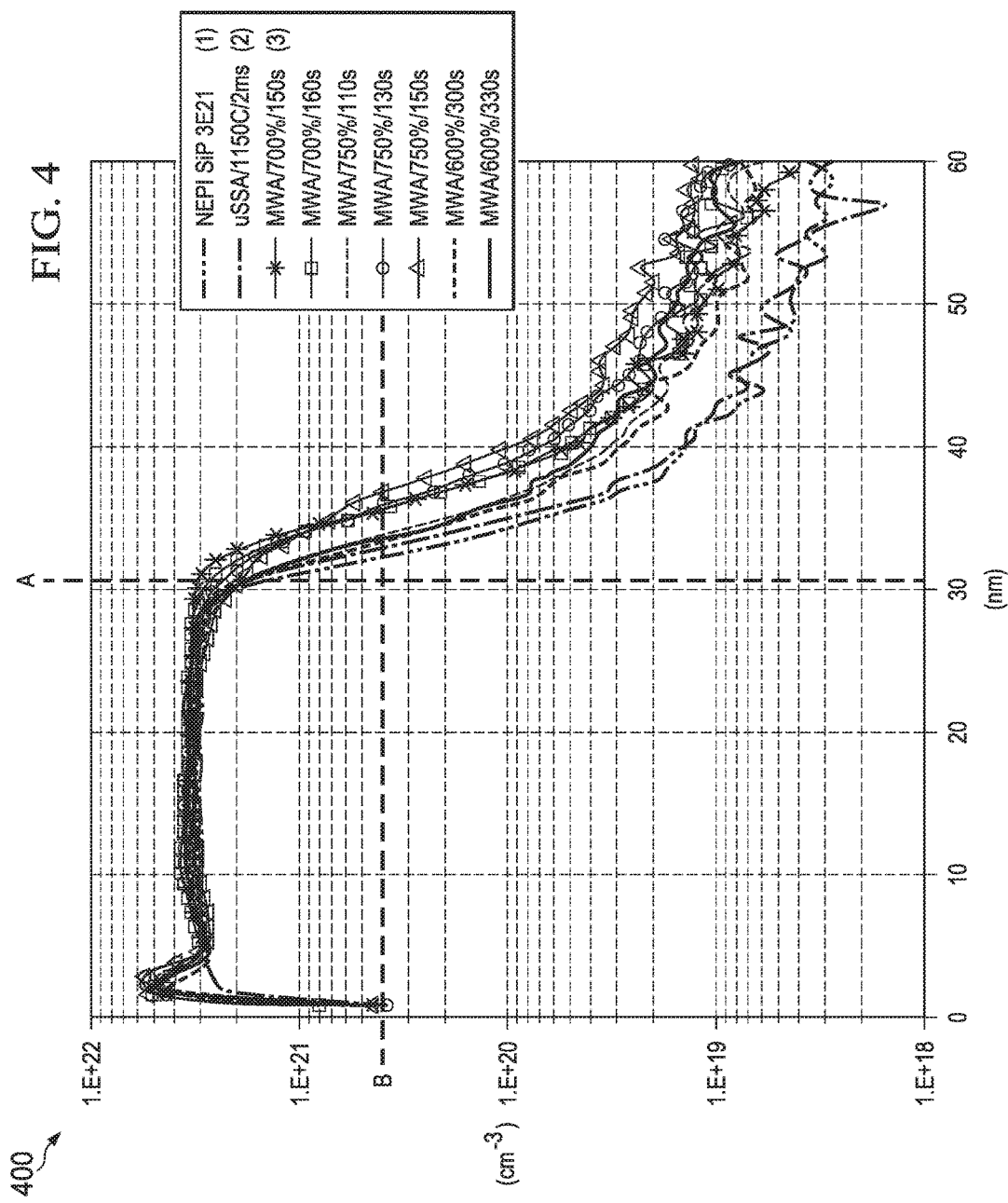
FIG. 4 shows dopant diffusion effects of different processes based on Secondary Ion Mass Spectrometry (SIMS).

In various embodiments, the parameters of the MWA process, such as its power and duration, can be selected based on a number of factors including dopant concentration of the SPD layer 324 and desired profile of the LDD regions 326. FIG. 4 shows a graph 400 of dopant diffusion effects of different MWA processes based on Secondary Ion Mass Spectrometry (SIMS). Referring to FIG. 4, the graph 400 includes nine (9) curves and each curve represents dopant concentration in a portion of the fin 306 that includes the SPD layer 324 and the fin portion underneath the spacers 320/318 (FIG. 3I). Furthermore, the dashed line A-A indicates the position of the sidewall of the SPD layer 324 that is closer to the channel region 308 in the "z" direction (FIG. 3I), and the dashed line B-B indicates a desired dopant concentration in the LDD regions 326 (FIG. 3I), which in this example is set to $5 \times e^{20}$ $cm^{-3}$. As shown by curve (1) in FIG. 4, after the SPD layer 324 is doped with a dopant concentration $3 \times e^{21}$ $cm^{-3}$ and before an μSSA or an MWA process is applied, there is slight dopant diffusion about 1 nm to 2 nm before the dopant concentration drops below the B-B line. As shown by curve (2) in FIG. 4, after an μSSA process is applied at 1150° C. for 2 milliseconds, the dopant concentration profile in the fin 306 remains substantially unchanged. This shows that the μSSA process activates the dopant but does not cause the dopant to substantially diffuse. As shown by curve (3) in FIG. 4, after an MWA process is applied with power 4200 watts for 150 seconds, the dopant diffusion length increases substantially from about 2 nm to about 7 nm before the dopant concentration drops below the B-B line. Other curves can be explained similarly. Based on the graph 400, a suitable MWA process can be selected to achieve a desired dopant concentration profile in the LDD region 326 without much difficulty.

Referring back to FIG. 3I, the LDD regions 326 thereby formed have substantially uniform dopant concentration on the top side and the sidewalls of the fin 306, effectively overcoming the FinFET shadowing effects associated with traditional ion implantation method.

The method 200 (FIG. 2A) continues to operation 214 to form final FinFET device 300. In an embodiment, operation 214 includes operations 216, 218, 220, and 222 as shown in FIG. 2B, which will be briefly described below in conjunction with FIG. 3J.

Figure 3J:
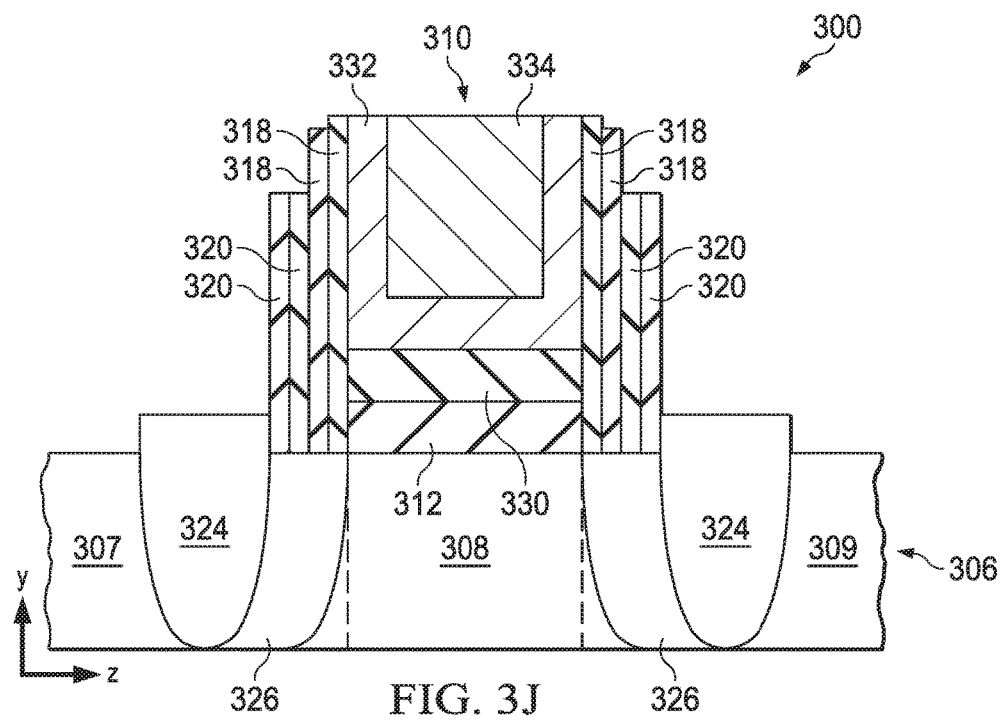

At operation 216, the method 200 (FIG. 2B) removes the poly layer 314 and deposits a high-k dielectric layer 330 into the gate structure 310 (FIG. 3J). The high-k dielectric layer 330 may include a dielectric material such as hafnium oxide ($HfO_2$), $Al_2O_3$, lanthanide oxides, $TiO_2$, HfZrO, $Ta_2O_3$, $HfSiO_4$, $ZrO_2$, $ZrSiO_2$, combinations thereof, or other suitable material. The high-k dielectric layer 330 may be formed by ALD and/or other suitable methods.

At operation 218, the method 200 (FIG. 2B) performs a post-dielectric-layer annealing. In an embodiment, this is a rapid thermal annealing (RTA) process. For example, the RTA process can be performed at a peak temperature of about 950° C. to 1010° C., at a pressure of about 760 torr, and for duration in a range of about 1 second to about 4 seconds.

At operation 220, the method 200 (FIG. 2B) deposits a metal gate stack which may include multiple layers. In the present embodiment as shown in FIG. 3J, the metal gate stack includes a work function metal layer 332 and a metal fill layer 334. In the present embodiment, the work function metal layer 332 is an n-type work function metal layer. Exemplary n-type work function metals include Ti, Ag, TaAl, TaAlC, TiAlN, TaC, TaCN, TaSiN, Mn, Zr, other suitable n-type work function materials, or combinations thereof. In alternative embodiments, the work function metal layer 332 can be a p-type work function metal layer for a p-FinFET. Exemplary p-type work function metals include TiN, TaN, Ru, Mo, Al, WN, $ZrSi_2$, $MoSi_2$, $TaSi_2$, $NiSi_2$, WN, other suitable p-type work function materials, or combinations thereof. The work function metal layer 332 may include a plurality of layers. The work function metal layer(s) 332 may be deposited by CVD, PVD, and/or other suitable process. The metal fill layer 334 may include aluminum (Al), tungsten (W), or copper (Cu) and/or other suitable materials. The fill layer 334 may be formed by CVD, PVD, plating, and/or other suitable processes, followed by a chemical mechanical planarization (CMP) process.

At operation 222, the method 200 (FIG. 2B) performs a post-metal-gate annealing. In an embodiment, this is a RTA process similar to the RTA process in operation 218.

Further operations may be performed to form final FinFET device 300. For example, an inter-layer dielectric (ILD) layer may be formed covering the fin 306 and the gate structure 310. Thereafter, contacts are formed to provide electrical connection from the SPD layers 324 and the gate structure 310 to one or more interconnect layers of a multilayer interconnect (MLI).

Figure 5:
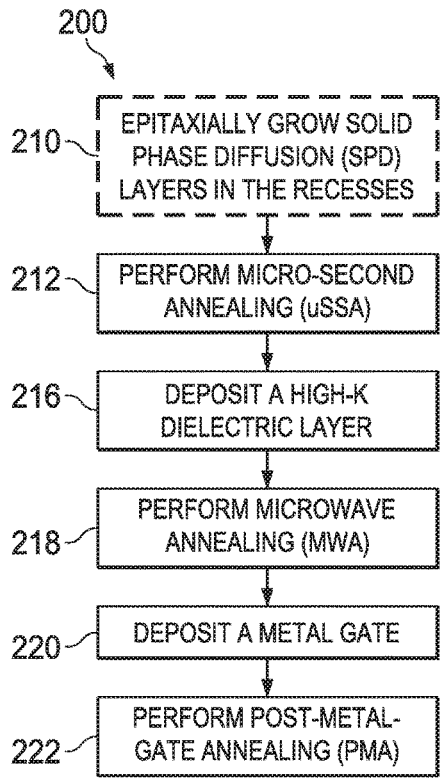
FIGS. 5, 6, and 7 show alternative operations of the method of FIGS. 2A and 2B, in accordance with some embodiments.
Figure 6:
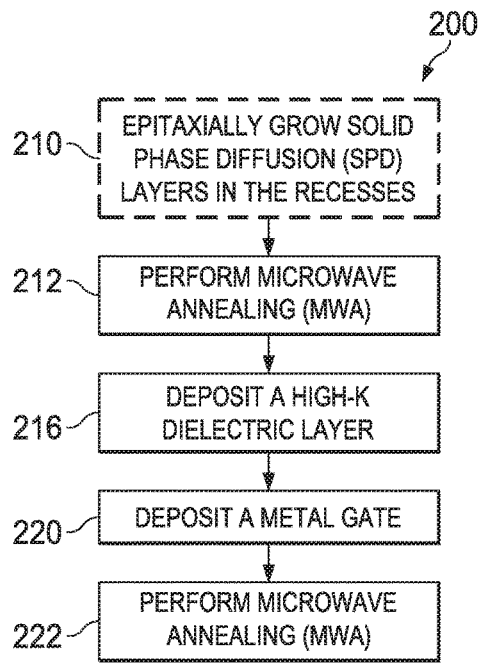
Figure 7:
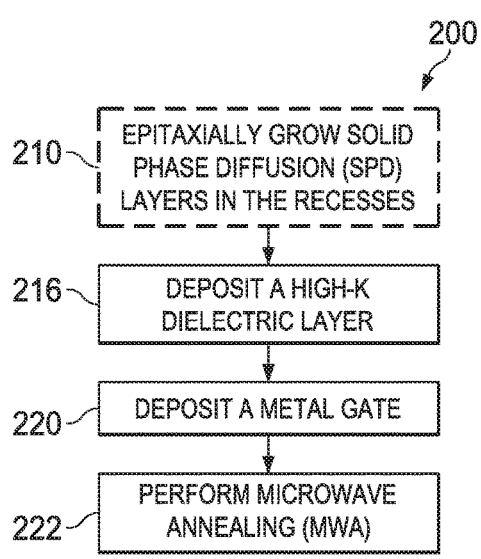

FIGS. 5-7 provide alternative embodiments of method 200 in creating the LDD regions 326 by solid phase dopant diffusion.

Referring to FIG. 5, in an embodiment, after the SPD layer 324 has been formed in operation 210, method 200 performs an μSSA process in operation 212 but does not perform an MWA process until operation 218. This effectively combines dopant diffusion annealing and post-dielectric-layer annealing in one operation thereby saving fabrication time.

Referring to FIG. 6, in an embodiment, after the SPD layer 324 has been formed in operation 210, method 200 performs an MWA process in operation 212 and combines the post-dielectric-layer annealing (operation 218 of FIG. 2B) and the post-metal-gate annealing (operation 222 of FIG. 2B) into one MWA process in operation 222.

Referring to FIG. 7, after the SPD layer 324 has been formed in operation 210, method 200 does not perform an MWA process until after the dielectric layer 330 and the meta gate 332/334 have been deposited. This effectively combines dopant diffusion annealing, post-dielectric-layer annealing, and post-metal-gate annealing into one MWA process in operation 222 thereby saving fabrication time.

Although not intended to be limiting, one or more embodiments of the present disclosure provide many benefits to a FinFET device and the formation thereof. One benefit is that the FinFET device thus formed will have substantially uniform LDD regions in the fin on three sides of interest—its top side and vertical sidewalls. This effectively eliminates the shadowing effects caused by traditional ion implantation method and greatly improves the performance of the FinFET device. Another benefit is that the LDD region profile and dopant diffusion length can be well controlled by controlling the SPD layer dopant concentration and selecting an appropriate MWA process. Yet another benefit is that the SPD layer formation and dopant diffusion can be flexibly integrated with existing processes, such as a gate-last high-k metal gate formation process.

In one exemplary aspect, the present disclosure is directed to a method of forming a fin field effect transistor (FinFET). The method includes forming a fin on a substrate, the fin having a channel region therein. The method further includes forming a gate structure engaging the fin adjacent to the channel region and forming a spacer on sidewalls of the gate structure. The method further includes forming two recesses in the fin, the two recesses being adjacent to the spacer and on opposite sides of the gate structure. The method further includes epitaxially growing a solid phase diffusion (SPD) layer in the two recesses, the SPD layer containing a first concentration of a dopant; and performing an annealing process thereby diffusing the dopant into the fin underneath the spacer and forming lightly doped source/drain (LDD) regions therein.

In another exemplary aspect, the present disclosure is directed to a method of forming a semiconductor device. The method includes providing a substrate and forming a projection extending upwardly from the substrate, the projection having a channel region therein. The method further includes forming a gate structure engaging the projection adjacent to the channel region; forming spacers on sidewalls of the gate structure; and forming two recesses in the projection adjacent to the spacers, the two recesses being on opposite sides of the channel region. The method further includes forming two heavily doped source/drain (HDD) regions, one in each of the two recesses; and performing a microwave annealing (MWA) process thereby forming two lightly doped source/drain (LDD) regions in the projection, the two LDD regions sandwiching the channel region.

In yet another exemplary aspect, the present disclosure is directed to a method of forming a fin field effect transistor (FinFET). The method includes forming a fin on a silicon substrate, the fin having a channel region therein; The method further includes forming a gate structure on top and sidewalls of the fin adjacent to the channel region; forming spacers on sidewalls of the gate structure; and forming two recesses in the fin, the two recesses being adjacent to the spacer and on opposite sides of the channel region. The method further includes epitaxially growing a silicon layer in the two recesses, the silicon layer containing a first concentration of a dopant; and performing a microwave annealing (MWA) process thereby diffusing the dopant into the fin underneath the spacer and forming two lightly doped source/drain (LDD) regions therein, the two LDD regions sandwiching the channel region.

The foregoing outlines features of several embodiments so that those of ordinary skill in the art may better understand the aspects of the present disclosure. Those of ordinary skill in the art should appreciate that they may readily use the present disclosure as a basis for designing or modifying other processes and structures for carrying out the same purposes and/or achieving the same advantages of the embodiments introduced herein. Those of ordinary skill in the art should also realize that such equivalent constructions do not depart from the spirit and scope of the present disclosure, and that they may make various changes, substitutions, and alterations herein without departing from the spirit and scope of the present disclosure.

What is claimed is:

1. A fin field effect transistor (FinFET), comprising:
   a substrate;
   a fin over the substrate, the fin having a channel region;
   a gate structure engaging the fin adjacent to the channel region;
   a spacer on sidewalls of the gate structure;
   first and second heavily doped source/drain (HDD) features at least partially in the fin, on opposing sides of the gate structure, and adjacent to the spacer, wherein the first HDD feature includes a first layer and a second layer over the first layer, wherein the first layer has an n-type dopant at a first concentration that is higher than a second concentration of the n-type dopant in the second layer; and
   first and second lightly doped source/drain (LDD) regions in the fin between the first and second HDD features, respectively, and the channel region, wherein a sidewall of the first HDD feature and a sidewall of the first LDD region have substantially a same shape.

2. The FinFET of claim 1, wherein the sidewall of the first HDD feature and the sidewall of the first LDD region are substantially in parallel.

3. The FinFET of claim 1, wherein the sidewall of the first HDD feature is substantially aligned with an outer surface of the spacer from a top view.

4. The FinFET of claim 1, wherein the sidewall of the first HDD feature extends underneath the spacer towards the channel region.

5. The FinFET of claim 1, wherein the sidewall of the first HDD feature and the sidewall of the first LDD region have a substantially u-shaped profile.

6. The FinFET of claim 1, wherein the sidewall of the first HDD feature and the sidewall of the first LDD region have a substantially diamond-shaped profile.

7. The FinFET of claim 1, wherein the first concentration is at least $1 \times e^{21}$ cm$^{-3}$, and the first LDD region has a concentration of the n-type dopant less than the first concentration and at least $5 \times e^{20}$ cm$^{-3}$.

8. The FinFET of claim 1, wherein the first HDD feature further includes a third layer over the second layer, the third layer having the n-type dopant at a third concentration that is higher than the second concentration.

9. The FinFET of claim 1, wherein a sidewall of the second HDD feature and a sidewall of the second LDD region have substantially a same shape.

10. The FinFET of claim 9, wherein the sidewall of the second HDD feature and the sidewall of the second LDD region are substantially in parallel.

11. The FinFET of claim 1, wherein the first LDD region has a concentration of a dopant at least $5 \times e^{20}$ cm$^{-3}$ on a top portion and side portions of the fin.

12. The FinFET of claim 11, wherein a dimension of the first LDD region ranges from 2 nanometers (nm) to 10 nm as measured along a longitudinal direction of the fin.

13. A fin field effect transistor (FinFET), comprising:
    a substrate having a top surface;
    a fin over the substrate, the fin having a channel region;
    a gate structure over the fin adjacent to the channel region;
    a spacer on sidewalls of the gate structure, the spacer having an outer surface;
    first and second heavily doped source/drain (HDD) features at least partially in the fin, on opposing sides of the gate structure, wherein the first HDD feature has a first sidewall adjacent to the spacer and a second sidewall away from the spacer, the first sidewall being aligned with the outer surface of the spacer along a direction normal to the top surface of the substrate; and
    first and second lightly doped source/drain (LDD) regions in the fin between the first and second HDD features, respectively, and the channel region, wherein the first sidewall of the first HDD feature and a sidewall of the first LDD region have substantially a same shape and are substantially in parallel, and a sidewall of the second HDD feature and a sidewall of the second LDD region have substantially a same shape and are substantially in parallel.

14. The FinFET of claim 13, wherein each of the first and second HDD features has a first concentration of a dopant at least $1 \times e^{21}$ cm$^{-3}$, and each of the first and second LDD regions has a concentration of the dopant less than the first concentration and at least $5 \times e^{20}$ cm$^{-3}$.

15. The FinFET of claim 13, wherein each of the first and second LDD regions has a concentration of a dopant at least $5 \times e^{20}$ cm$^{-3}$ on a top portion and side portions of the fin.

16. The FinFET of claim 13, wherein the first HDD feature includes a first layer, a second layer over the first layer, and a third layer over the second layer.

17. The FinFET of claim 16, wherein concentrations of a dopant in the first and third layers are higher than a concentration of the dopant in the second layer.

18. A fin field effect transistor (FinFET), comprising:
    a substrate;
    a fin over the substrate, the fin having a channel region;
    a gate structure engaging the fin adjacent to the channel region;
    a spacer on sidewalls of the gate structure;
    first and second heavily doped source/drain (HDD) features at least partially in the fin, on opposing sides of the gate structure, and adjacent to the spacer, wherein the first HDD feature includes a first layer and a second layer over the first layer, wherein the first layer has a dopant at a first concentration that is higher than a second concentration of the dopant in the second layer; and
    first and second lightly doped source/drain (LDD) regions in the fin between the first and second HDD features, respectively, and the channel region, wherein a sidewall of the first HDD feature and a sidewall of the first LDD region have substantially a same shape and are substantially in parallel.

19. The FinFET of claim 18, wherein the dopant is an n-type dopant.

20. The FinFET of claim 18, wherein the first HDD feature further includes a third layer over the second layer, the third layer having the dopant at a third concentration that is higher than the second concentration.

* * * * *